United States Patent
Lang et al.

(10) Patent No.: US 11,538,521 B2
(45) Date of Patent: *Dec. 27, 2022

(54) ADAPTIVE APPLICATION OF VOLTAGE PULSES TO STABILIZE MEMORY CELL VOLTAGE LEVELS

(71) Applicant: MICRON TECHNOLOGY, INC., Boise, ID (US)

(72) Inventors: Murong Lang, San Jose, CA (US); Tingjun Xie, Milpitas, CA (US); Zhenming Zhou, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/222,949

(22) Filed: Apr. 5, 2021

(65) Prior Publication Data

US 2021/0225442 A1 Jul. 22, 2021

Related U.S. Application Data

(63) Continuation of application No. 16/551,104, filed on Aug. 26, 2019, now Pat. No. 10,971,228.

(51) Int. Cl.
*G11C 7/10* (2006.01)
*G11C 13/00* (2006.01)
*H01L 27/24* (2006.01)

(52) U.S. Cl.
CPC .......... *G11C 13/004* (2013.01); *G11C 7/1051* (2013.01); *H01L 27/2481* (2013.01)

(58) Field of Classification Search
CPC .................................................. G11C 13/004
See application file for complete search history.

(56) References Cited

U.S. PATENT DOCUMENTS

| 9,355,715 | B1 * | 5/2016 | Kim .................... G11C 11/5642 |
| 10,971,228 | B2 * | 4/2021 | Lang .................... G11C 29/021 |
| 2009/0168504 | A1 * | 7/2009 | Lee .................... G11C 16/3431 365/163 |
| 2011/0051507 | A1 * | 3/2011 | Sarkar ................ G11C 13/0033 711/E12.001 |
| 2012/0239991 | A1 | 9/2012 | Melik-Martirosian |
| 2015/0220388 | A1 | 8/2015 | Wu et al. |
| 2016/0078966 | A1 * | 3/2016 | Li ........................ G11C 16/349 714/723 |
| 2016/0180958 | A1 | 6/2016 | Raghunathan et al. |

* cited by examiner

*Primary Examiner* — Min Huang
(74) *Attorney, Agent, or Firm* — Lowenstein Sandler LLP (57) ABSTRACT

A method is disclosed that includes causing a first set of a plurality of voltage pulses to be applied to memory cells of a memory device, a voltage pulse of the first set of the voltage pulses placing the memory cells of the memory device at a voltage level associated with a defined voltage state. The method also includes determining a set of bit error rates associated with the memory cells of the memory device in view of a data mapping pattern for the memory cells of the memory device, wherein the data mapping pattern assigns a voltage level associated with a reset state to at least a portion of the memory cells of the memory device. The method further includes determining whether to apply one or more second sets of the voltage pulses to the memory cells of the memory device in view of a comparison between the set of bit error rates for the memory cells and a previously measured set of bit error rates for the memory cells.

20 Claims, 6 Drawing Sheets

FIG. 6

US 11,538,521 B2

ADAPTIVE APPLICATION OF VOLTAGE PULSES TO STABILIZE MEMORY CELL VOLTAGE LEVELS

RELATED APPLICATIONS

This application is a continuation application of co-pending U.S. patent application Ser. No. 16/551,104, filed Aug. 26, 2019, which is herein incorporated by reference.

TECHNICAL FIELD

The present disclosure generally relates to a memory sub-system, and more specifically, relates to adaptive application of voltage pulses to stabilize memory cell voltage levels for memory sub-systems.

BACKGROUND

A memory sub-system can be a storage device, a memory module, and a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to adaptive application of voltage pulses to stabilize memory cell voltage levels in a memory sub-systems. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

The memory components can include non-volatile memory devices that store data from the host system. A non-volatile memory device is a package of one or more dice. The dice in the packages can be assigned to one or more channels for communicating with a memory sub-system controller. The non-volatile memory devices include cells (i.e., electronic circuits that store information), that are grouped into pages to store bits of data. The non-volatile memory devices can include three-dimensional cross-point ("3D cross-point") memory devices that are a cross-point array of non-volatile memory that can perform bit storage based on a change of bulk resistance, in conjunction with a stackable cross-gridded data access array. Other types of non-volatile memory devices are described below in conjunction with FIG. 1.

A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory sub-system can include memory devices that can be combined with other components during the manufacturing process. In some instances, a memory device can be affixed to another component so that the components can function together. For example, a memory device can be combined with other electronic components in a cellular phone, a computer, an automobile, an embedded system, etc. The process of affixing the memory device to another component can expose the memory device to a heating process (e.g., soldering) used during assembly to ensure reliable surface mounting. This heating process can expose the memory device to extreme temperatures (e.g., 200 degrees Celsius to 300 degrees Celsius).

In conventional memory sub-systems, this heating process can negatively impact the reliability of memory devices. The extreme temperatures used in the heating process can, over a period of time, cause crystallization of areas of the memory device (e.g., amorphous phase change memory in reset memory cells). This crystallization can result in abnormally high voltage levels within the memory cells of the memory device after the heating process is performed. This can negatively impact reliability as the high voltage levels can cause voltage level instability, resulting in a higher error rate for the memory device during the initial operating life of the memory sub-system.

For example, during the early operating life of a memory device, the set state and reset state for a memory cell can register higher than expected voltage levels with respect to a predefined threshold voltage read level. As such, a memory cell of a memory device that should be in a state indicative of a set state (e.g., a lower voltage level associated with a bit value of '1'), could be interpreted by a read operation as a higher voltage level that could be indicative of a reset state (e.g., a higher voltage level associated with a bit value of '0'). This, in turn, can result in a higher error rate due to the drift in observed voltage levels that can impact the representative voltage state of the affected memory cells. While a program operation can be performed to program a memory cell to a set state, the voltage state of the memory cell could indicate differently in response to a read operation as a result of the voltage level drift.

Conventional memory sub-systems that are configured in this manner typically address the resulting reliability issues by performing repetitive cycles of specialized programming operations on the memory device to stabilize the voltage levels of the memory cells. This process can typically be referred to as memory cell "seasoning." Memory cell seasoning cycles can apply voltage pulses to the memory device that can, over time, stabilize the voltage levels of the memory cells to predetermined set and reset voltage states.

In conventional memory sub-systems, the seasoning process is typically applied at the same rate for all memory devices of a memory-subsystem. For example, conventional memory sub-systems can apply the same number of seasoning cycles to all memory devices of the memory sub-system. In such instances, some memory devices can reach stable voltage levels with fewer seasoning cycles, while some memory devices can reach stable voltage levels with more seasoning cycles. Applying a single number of seasoning cycles, therefore, can over season or under season various memory devices within the memory sub-system. Over seasoning a memory devices can expose that memory device to more voltage pulses than is necessary to stabilize voltage levels, which can significantly reduce the lifespan of that memory device. Additionally, over seasoning can expend significant additional time and processing resources due to the unneeded seasoning cycles. Conversely, under seasoning a memory device can result in higher bit error rates due to the continued instability of the voltage levels during the early life of the memory device.

Aspects of the present disclosure address the above and other deficiencies by performing adaptive memory cell seasoning that can self-regulate the number of cycles applied to a memory device based on observed bit error rates for the memory cells of that memory device. The adaptive memory cell seasoning can apply groups of voltage pulses to the memory cells of a memory device, and determine a set of bit error rates associated with the cells of the memory device after each group of pulses. If the determined bit error rates does not satisfy a threshold condition associated with stabilized voltage levels, the process can be repeated until the observed bit error rates satisfy the threshold condition. The adaptive memory cell seasoning can, therefore, adapt to the conditions of the media and adjust the seasoning process to account for those conditions.

Advantages of the present disclosure include, but are not limited to, improved reliability of a memory device during its early operating life. Implementing the adaptive memory cell seasoning process of the present disclosure achieves the reliability benefits of a conventional seasoning process without the increased overhead of excessive unneeded seasoning cycles. This can significantly improve the overall ability to bring the memory cells of a memory device to stabile voltage levels with a minimum number of seasoning cycles, avoiding wasted resources and overtaxing the memory devices by over seasoning, as well as improving the reliability of memory devices that would otherwise be impacted by under seasoning. Additionally, the resources used during the seasoning process can be significantly reduced in terms of overall time, energy expended, and processing resources used for the seasoning process since the number of seasoning cycles can often be reduced. Moreover, since the reliability of the memory device is improved, the performance of a memory sub-system that includes the memory device also improves, since fewer resources are used to perform unneeded seasoning cycles.

Figure 1:
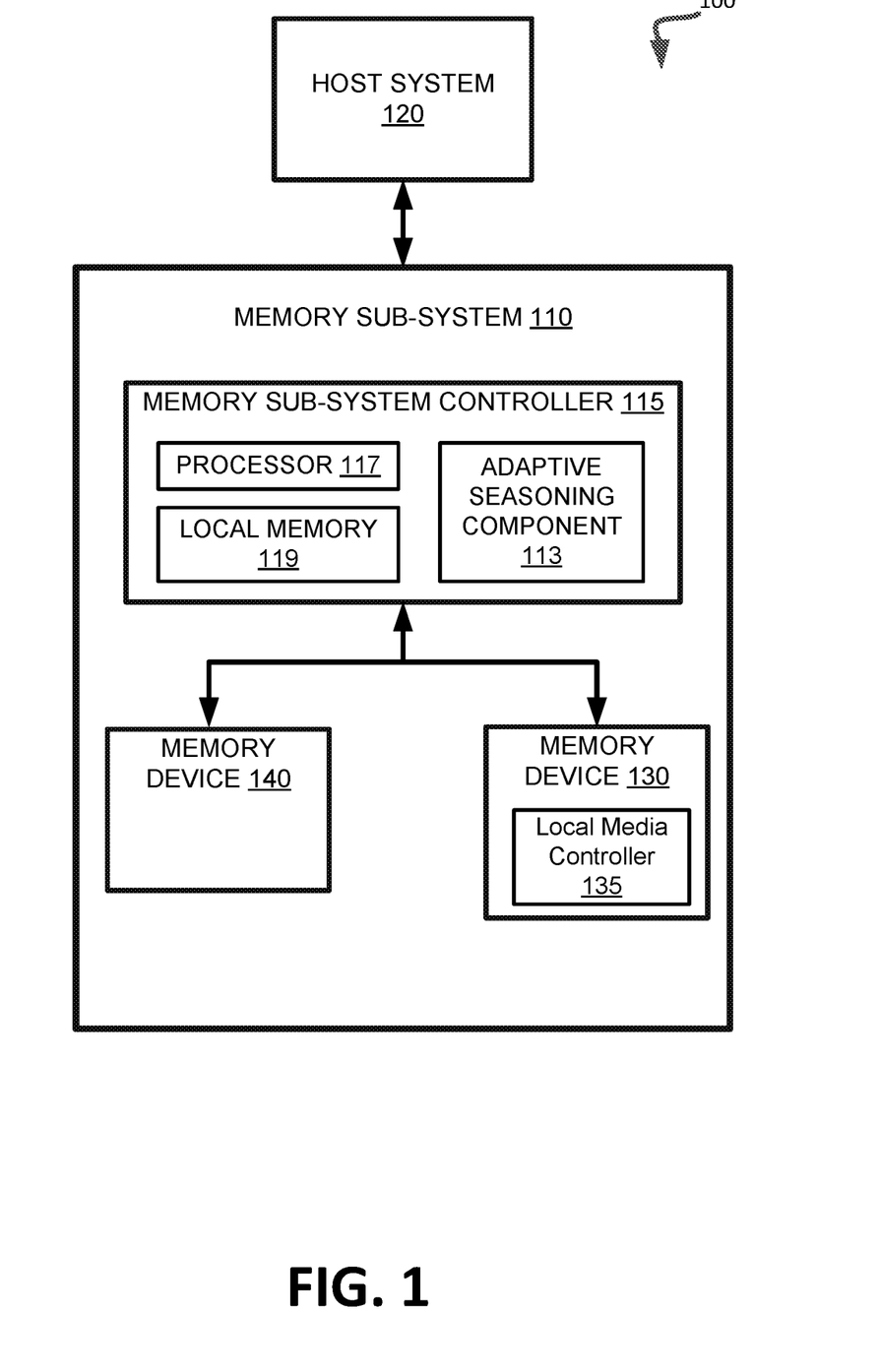
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

The cells can store one or more bits per cell. In one embodiment, each of the memory devices 130 can include one or more arrays of memory cells such as single level cells (SLCs), multi-level cells (MLCs), triple level cells (TLCs), or quad-level cells (QLCs), or a combination of such. In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or codewords that can refer to a logical unit of the memory component or device used to store data. With some types of memory (e.g., NAND), pages can be grouped to form blocks. Some types of memory, such as 3D cross-point), can group pages across dice and channels to form management units (MUs).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. In some embodiments, the memory devices 130 are managed memory devices, which is a raw memory device combined with a local controller (e.g., the local media controller 135) for memory management within the same memory device package.

The memory sub-system 110 includes an adaptive seasoning component 113 that can be used to perform adaptive seasoning of memory cells using sets of voltage pulses for memory cells of the memory devices (e.g., memory devices 130). In some embodiments, the memory sub-system controller 115 includes at least a portion of the adaptive seasoning component 113. For example, the memory sub-system controller 115 can include a processor 117 (processing device) configured to execute instructions stored in local memory 119 for performing the operations described herein. In some embodiments, the adaptive seasoning component 113 is part of the host system 120, an application, or an operating system.

The adaptive seasoning component 113 can, upon receiving a request to perform a seasoning operation on the memory cells of a memory device (e.g., memory devices 130), apply a group of voltage pulses to the memory cells of the memory device. In some embodiments, a voltage pulse in the group of voltage pulses can place the memory cells at a voltage level associated with a defined voltage state (e.g., a set voltage state, a reset voltage state, a high voltage state that is at a higher voltage level than the set or reset voltage states, etc.). After applying the group of voltage pulses, the adaptive seasoning component 113 can determine a set of bit error rates associated with the memory cells of the memory device. The adaptive seasoning component 113 can then determine whether the set of bit error rates satisfies a threshold condition. In one embodiment, the threshold condition can be based on a predetermined bit error rate. Alternatively, the threshold condition can be based on a measured changed in the bit error rates over time (e.g., the difference between the measured bit error rates and a previously measured set of bit error rates). If the set of bit error rates does not satisfy the threshold condition, the adaptive seasoning component 113 can apply an additional group of voltage pulses to the memory cells of the memory device, repeating the seasoning cycle until the threshold condition is satisfied. Once the threshold condition is satisfied, the adaptive seasoning component 113 can terminate the seasoning operation for the memory device. Further details with regards to the operations of the adaptive seasoning component 113 are described below.

Figure 2:
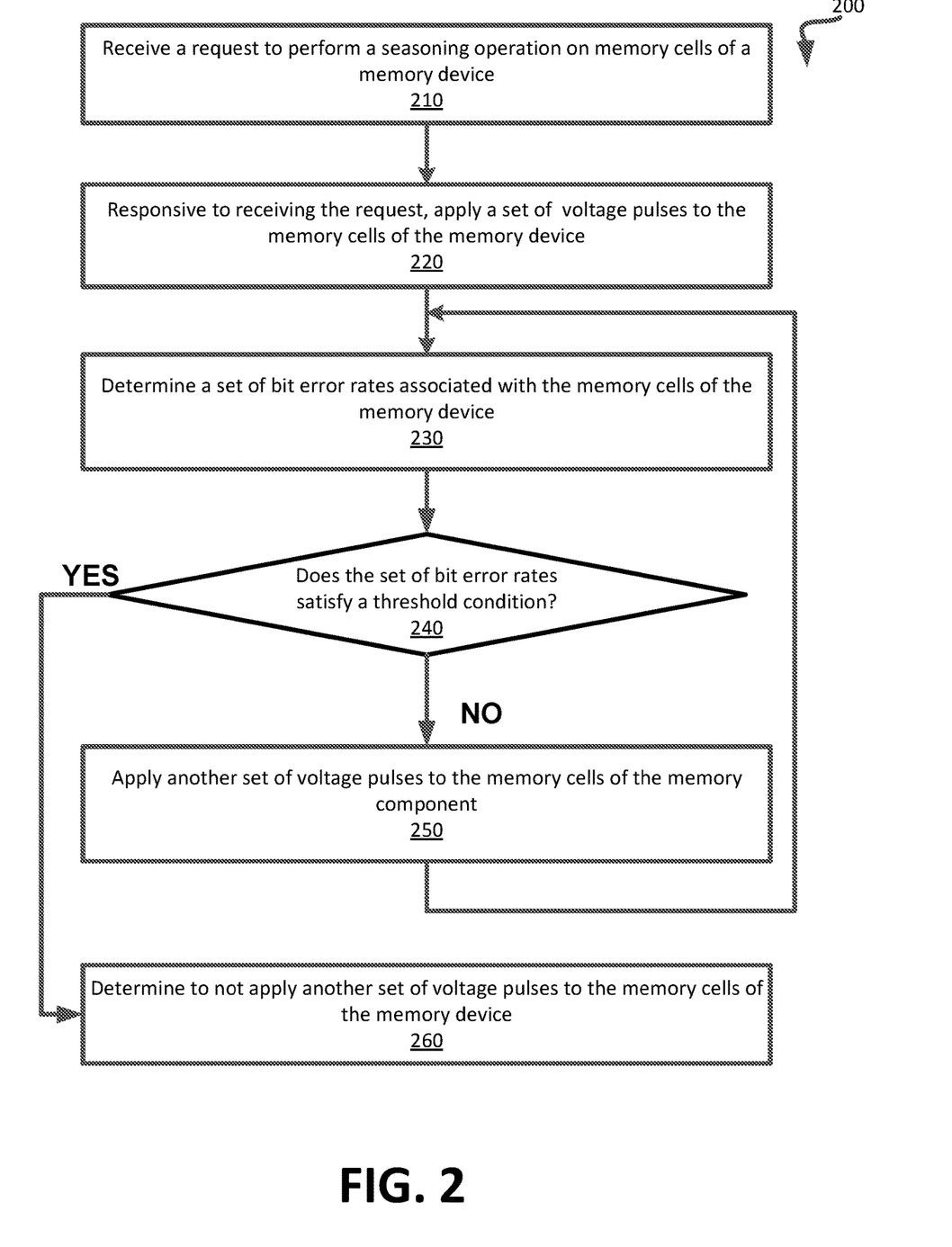
FIG. 2 is a flow diagram of an example method to apply sets of seasoning pulses to a memory device based on satisfying a threshold error rate value in accordance with some embodiments.

FIG. 2 is a flow diagram of an example method 200 to apply sets of seasoning pulses to a memory device based on satisfying a threshold error rate value for a memory subsystem in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the adaptive seasoning component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing device receives a request to perform a seasoning operation on memory cells of a memory device to stabilize the voltage levels for the memory cells of the memory device. In some embodiments, the request can be received from a host system to perform the seasoning operation on the memory device. In one illustrative example, the request may be received from a management console (e.g., entered by an administrative user) to initiate the seasoning operation. Alternatively, the command may be initiated by a host system upon detecting a connection between the host system and the memory device. In some implementations, the request may be a "season" command with associated parameters that control the number of seasoning voltage pulses to apply to the memory device. The command parameters can also include a data pattern (e.g., a pattern of data to program to the cell), a range of memory cells to which to apply the voltage pulses, or the like. In some embodiments, the memory device can be a 3D memory device. In some embodiments, the memory device can be a 3D cross-point memory device. As noted above, a 3D cross-point memory device can be made up of multiple layers of memory cells, where each layer can include a 2D grid of memory cells, and where the layers of the 3D cross-point memory device can be stacked vertically in relation to each other.

At operation 220, responsive to receiving the request to perform the seasoning operation, the processing device applies a set of voltage pulses to the memory cells of the memory device, where a voltage pulse of the set of voltage pulses places the memory cells of the memory device at a voltage level associated with a defined voltage state. In some embodiments, the number of voltage pulses in the set of voltage pulses can be configurable. For example, the number of pulses in the set can be configured as a defined number (e.g., 5 pulses, 10 pulses, 15 pulses, etc.). In some embodiments, the number of pulses in the set can be determined based on physical characteristics and or materials of the memory device, the amount of heat applied to the memory device, the duration of the heating process, or the like. Alternatively, the number of pulses in the set can be determined based on stored historical information associated with memory devices of a similar device type. In these instances, the number of pulse used to stabilize the voltage levels for memory cells in similar types of memory devices can be used to configure the number of pulses used in the set of voltage pulses. In some embodiments, the number of pulses may be determined by a host system and sent to the memory device in the "season" command received at operation 210. In some embodiments, the defined voltage state can be associated with a programmed state. In other words, the defined voltage state can be a voltage state associated with a "set" voltage state (e.g., a voltage state associated with a voltage level that sets the memory cell to a value of '1'), a "reset" voltage state (e.g., a voltage state associated with a voltage level that sets the memory cell to a value of '0'), a high voltage state (e.g., a voltage state associated with a voltage level that higher than the voltage levels associated with the set or reset voltage states), or the like.

In an illustrative example, the voltage level associated with placing a memory cell in a set state can be between 3.5 Volts (V) and 4.5 V and the voltage level associated with placing the memory cell in a reset state can be between 5.6 V and 6 V. The voltage pulses can be applied at a voltage level between 3.5 V and 4.5 V (e.g., the set state voltage level), at a voltage level between 5.6V and 6 V (e.g., the reset state voltage level), or at a voltage level that is higher than both ranges (e.g. a voltage level between 8 V and 9 V).

In some embodiments, the voltage pulses can be applied to the memory cells for a duration associated with placing the memory cell in a programmed state. In such instances, the processing device can determine a voltage pulse duration associated with placing the memory cell in a programmed state, and subsequently perform the voltage pulse for the determined duration (or for a duration that is approximately equivalent to the determined duration). In other embodiments, the voltage pulses can be applied to the memory cells for a longer duration than pulses used to place the memory cells in a programmed state. In such instances, the processing device can determine the voltage pulse duration associated with placing the memory cell in a programmed state, and subsequently perform the voltage pulse for a duration that is longer than the determined duration.

At operation 230, the processing device determines a set of bit error rates (e.g., raw bit error rate (RBER)) associated with the memory cells of the memory device. In some embodiments, the processing device can determine one set of bit error rates for a portion of the memory cells having a voltage state associated with a set state (e.g., a set state RBER), and a second set of bit error rates for a portion of the memory cells having a voltage state associated with a reset state (e.g., reset state RBER). In some implementations, the set state RBER and reset state RBER can be determined based on the voltage distributions associated with the set state and reset state respectively. As shown below with respect to FIGS. 3A-3B, the set state voltage distribution can have a high edge "E2" and the reset state voltage distribution can have a lower edge "E3". In such instances, the set state RBER can be determined based on the high edge (E2) of the set state voltage distribution, yielding the RBER for the E2 portion of the distribution (e.g., the E2 RBER). Similarly, the reset state RBER can be determined based on the lower edge (E3) of the reset state voltage distribution, yielding the RBER for the E3 portion of the distribution (e.g., the E3 RBER). The RBER values can be determined for all of the memory cells of the memory device. Alternatively, the RBER values can be determined for a portion of the memory cells of the memory device. In the latter case, the processing device can select a designated pattern of memory cells that provide a representation of the voltage levels for the memory device. The memory cells in the designated pattern may be selected randomly (or pseudo-randomly), based on the proximity of the memory cells to the controller of the memory device, or in another similar manner.

In 3D cross-point memory implementations, the processing device can determine the sets of bit error rates by selecting memory cells from different layers of the 3D cross-point memory device. The layers can be selected randomly (or pseudo-randomly), sequentially, or in another similar manner. For example, if a 3D cross-point memory device has two layers (layer 0 and layer 1), the processing device can select layer 0 for the first memory cell, layer 1 for the second memory cell, layer 0 for the third memory cell, layer 1 for the fourth memory cell, and so on.

In one embodiment, the processing device determines a first bit error rate associated with a first portion of the memory cells of the memory device (e.g., the E2 RBER), the first portion of memory cells having a first voltage level associated with a set state (e.g., the E2 voltage level). To make this determination, the processing device can determine a data mapping pattern for the memory cells of the memory device, where the data mapping pattern assigns a first voltage level associated with the set state to a first portion of the memory cells of the memory device and assigns a second voltage level associated with the reset state to a second portion of the memory cells of the memory device. The processing device can then perform a programming operation on the memory device to set the memory cells of the memory device to a voltage level in view of the mapping pattern.

For example, the processing device can determine a mapping pattern that sets half of the memory cells in the pattern to a voltage level associated with the set state (e.g., a value of '1') and half of the memory cells in the pattern to a voltage level associated with the reset state (e.g., a value of '0'). The processing device can then perform the program operation that programs half of the memory cells in the pattern to the set state voltage level and half of the memory cells in the pattern to the reset state voltage level. As noted above, the mapping pattern can be defined so that all of the memory cells of the memory device are programmed. Alternatively, the mapping pattern may be defined so that only a portion of the memory cells of the memory device are programmed. In 3D memory implementations, the mapping pattern may be defined to target different layers of the 3D cross-point memory device.

The processing device can then perform a read operation of the memory cells of the memory device to generate a result set for the read operation. Subsequently, the processing device can compare the result set of the read operation to the data mapping pattern. In other words, the processing device can compare the expected results (the data mapping pattern) to the actual results (the result set). The processing device can then determine the first bit error rate (e.g., the E2 RBER) in view of the comparison.

In some embodiments, the processing device can determine a second bit error rate associated with a second portion of the memory cells of the memory device (e.g., the E3 RBER), the second portion of memory cells having a second voltage level associated with a reset state (e.g., the E3 voltage level). To make this determination, the processing device can determine a data mapping pattern for the memory cells of the memory device, where the data mapping pattern assigns a voltage level associated with the reset state (e.g., a value of '0') to at least a portion of the memory cells of the memory device. The processing device can then perform a programming operation on the memory device to set the memory cells of the memory device to a voltage level in view of the mapping pattern (e.g., to a reset state voltage level). As noted above, the mapping pattern may be defined so that all of the memory cells of the memory device are programmed. Alternatively, the mapping pattern may be defined so that only a portion of the memory cells of the memory device are programmed. In 3D memory implementations, the mapping pattern may be defined to target different layers of the 3D cross-point memory device.

The processing device can then perform a read operation of the memory cells of the memory device to generate a result set for the read operation. Subsequently, the processing device can compare the result set of the read operation to the data mapping pattern. In other words, the processing device can compare the expected results (the data mapping pattern) to the actual results (the result set). The processing device can then determine the second bit error rate (e.g., the E3 RBER) in view of the comparison.

At operation 240, the processing device determines whether the set of bit error rates satisfies a threshold condition. In one embodiment, the processing device make this determination by determining whether the E2 RBER satisfies one threshold number and the E3 RBER satisfies a second threshold number. The processing device can determine a first threshold number associated with a first maximum bit error rate for the memory cells with the voltage level associated with the set state (e.g., a maximum E2 RBER). Subsequently, the processing device can determine whether the first bit error rate (e.g., the E2 RBER) satisfies the first threshold number (e.g., the E2 RBER threshold). Similarly, the processing device can determine a second threshold number associated with a second maximum bit error rate for the memory cells with the voltage level associated with the reset state (e.g., a maximum E3 RBER). Subsequently, the processing device can determine whether the second bit error rate (e.g., the E3 RBER) satisfies the second threshold number (e.g., the E3 RBER threshold).

In various implementations, the threshold numbers can be determined based on observed statistical information captured from other similar memory devices that are similar to the memory device. In other words, historical data relating to the observed maximum E2 RBER and E3 RBER values of other similar devices may be used to determine the threshold values for the memory device. In some implementations, the historical data may be received and analyzed by a controller of the memory device. Alternatively, the historical data can be analyzed by a host system, and the resulting threshold numbers can be received from the host system. In some implementations, the threshold numbers can be adjusted in view of an error correction code implemented for the memory device. For example, in implementations where a powerful error correction code is implemented, a higher bit error rate can be tolerated, so the RBER thresholds can be set to higher values. Conversely, in implementations where a less powerful error correction code is implemented, the bit error rate tolerance could be lower, so the RBER thresholds can be set to lower values.

If at operation 240, the processing device determines that the set of bit error rates does not satisfy the threshold, processing continues to operation 250. At operation 250, the processing device applies another set of voltage pulses to the memory cells of the memory device. In some instances, this additional set of voltage pulses can be the same number of pulses as the number of pulses in the set applied at operation 220. Alternatively, the additional set of voltage pulses can include a larger number of pulses or a smaller number of pulses as the number of pulses in the set applied at operation 220. In some embodiments, the processing device can repeat operations 230 and 240, applying additional groups (e.g., additional sets) of voltage pulses and measuring the set of bit error rates until the set of bit error rates satisfies the threshold condition. If at operation 240, the processing device determines that the set of bit error rates does satisfy the threshold (e.g., the E2 RBER satisfies the E2 RBER threshold and the E3 RBER satisfies the RBER threshold), processing can proceed to operation 260 where the processing device determines to not apply an additional sets of voltage pulses to the memory cells of the memory device.

In some implementations, where the set of bit error rates do not ever satisfy the threshold conditions, the processing device can determine not to perform any additional groups of voltage pulses to the memory cells based on the number of groups of voltage pulses previously performed. In other words, if the number of total groups of voltage pulses performed on the memory cells satisfies a threshold number, then the processing device can determine not to perform any additional groups of voltage pulses.

An example of voltage states is illustrated below in conjunction with FIGS. 3A-3B. An illustrative example of performing the voltage pulses on memory cells is described below in conjunction with FIG. 4A-4C.

Figure 3A:
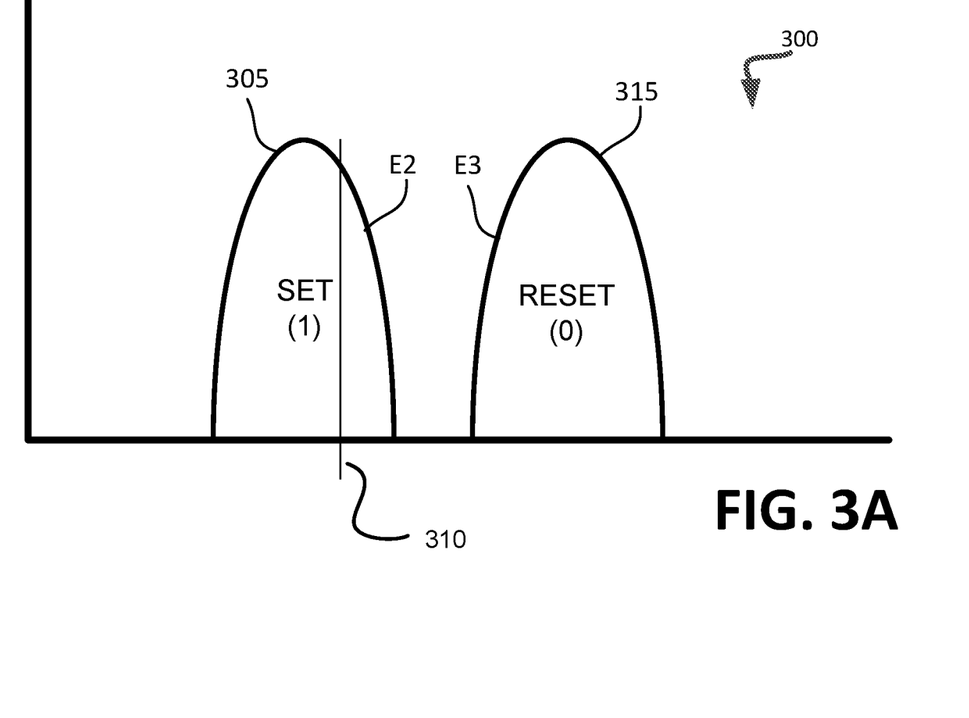
FIGS. 3A-3B illustrate voltage levels of memory cells in accordance with some embodiments of the present disclosure.
Figure 3B:
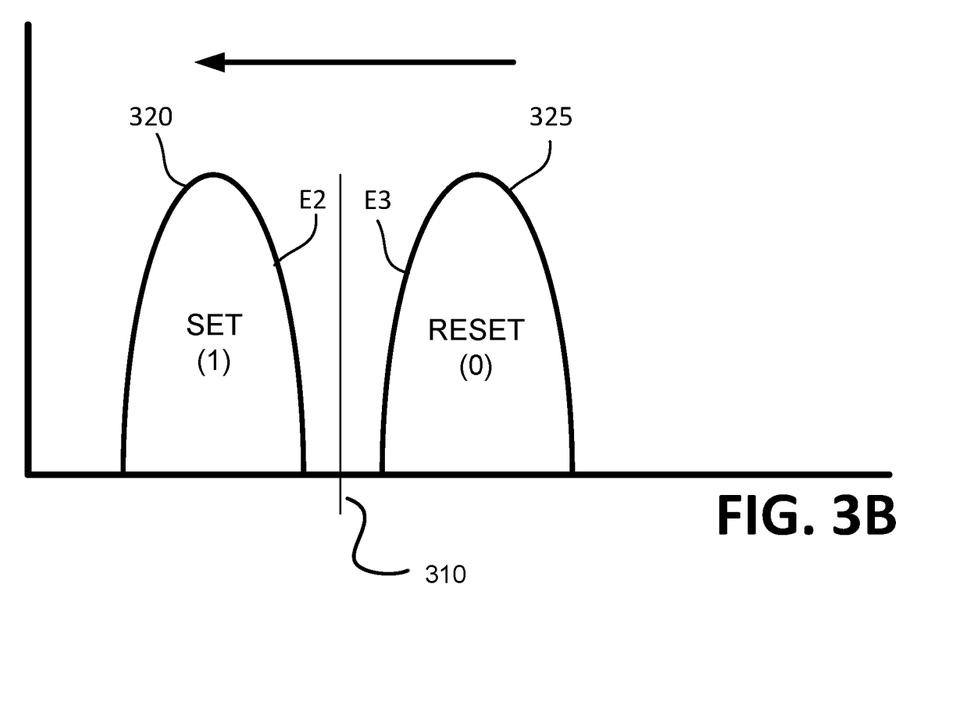

FIGS. 3A-3B illustrate voltage levels of memory cells before and after the application of seasoning voltage pulses in accordance with some embodiments of the present disclosure. In some embodiments, the application of the voltage pulses to stabilize voltage levels can be performed by the adaptive seasoning component 113 of FIG. 1 and as described above with respect to FIG. 2 and below with respect to FIG. 5.

As shown in FIGS. 3A-3B, a memory cell 300 can store multiple threshold voltage states where each state represents a logical bit value. FIGS. 3A-3B illustrate a memory cell that stores voltage states indicative of two logical states. This configuration can be used in a 3D cross point memory cell, which can store a single bit of information in each cell, and therefore each cell can have two possible states—one state representing a value '1' which can be indicative of a set state and the other state representing a value '0' which can be indicative of a reset state. For example, a first voltage state 305, 320 can represent the value '1,' and the second voltage state 315, 325 can represent the value '0.' Reference voltage 310 can represent the threshold voltage that can separate bits storing the values at the set state (a low voltage state) from those at the reset state (a higher voltage state).

FIG. 3A illustrates an example of voltage levels for voltage states of memory cell 300 prior to performance of any seasoning pulses as described herein. As shown, the voltage levels for voltage states 305 and 315 are representative of higher than normal voltage states (e.g., shifted to the right in relation to reference voltage 310). The leading edge E2 of the set state voltage 305 is higher than the reference voltage 310 and the trailing edge E3 of the reset state voltage 315 is much higher than the reference voltage 310. The presence of an set voltage state where the leading edge E2 is higher than the reference voltage 310 can result in increased error rates since a read operation could detect a voltage level for the set state 320 that would otherwise be indicative of the reset state under stable voltage levels (e.g., as illustrated by FIG. 3B). In other words, the memory cell of FIG. 3A could store a voltage level for set state 320 that could be interpreted during a read operation as indicative of a reset state.

As shown in FIG. 3B, the voltage levels for voltage states 320 and 325 are representative of a stable voltage state after the seasoning voltage pulses are applied to the memory cells of FIG. 3A by the adaptive seasoning component. As described above with respect to FIG. 2, sets of voltage pulse can be applied to memory cell 300 to stabilize the voltage levels. The voltage pulses can be applied to memory cell 300 to cause the voltage levels for the set state and reset state to shift left (e.g., to a lower voltage level) in relation to reference voltage 310. The leading edge E2 of the set state voltage 320 is lower than the reference voltage 310 and the trailing edge E3 of the reset state voltage 325 is higher than the reference voltage 310, but closer in relation to reference voltage 310 when compared to reset state voltage 315 (e.g., prior to application of the seasoning voltage pulses). Each set of seasoning voltage pulses can cause the voltage levels for the set state and reset state to progressively shift to the left until the stable voltage states (set state voltage 320 and reset state voltage 325) are reached. The stable voltage states indicate that there is a clear separation between the voltage levels for the two voltage states with respect to the reference voltage 310. In such cases, the performance of a read operation at the reference voltage 310 can distinguish between a set state and a reset state with fewer errors.

Although FIGS. 3A-3B illustrate two voltage states representing one bit, any number of voltage states to represent various combinations of bits can be stored at a memory cell. For example, the memory cell of FIGS. 3A-3B can be a multi-level cell (MLC), a triple-level cell (TLC), or a quad-level cell (QLC). The process of adaptively applying the voltage pulses to stabilize voltage levels is illustrated in further detail below with respect to FIGS. 4A-4C.

Figure 4A:
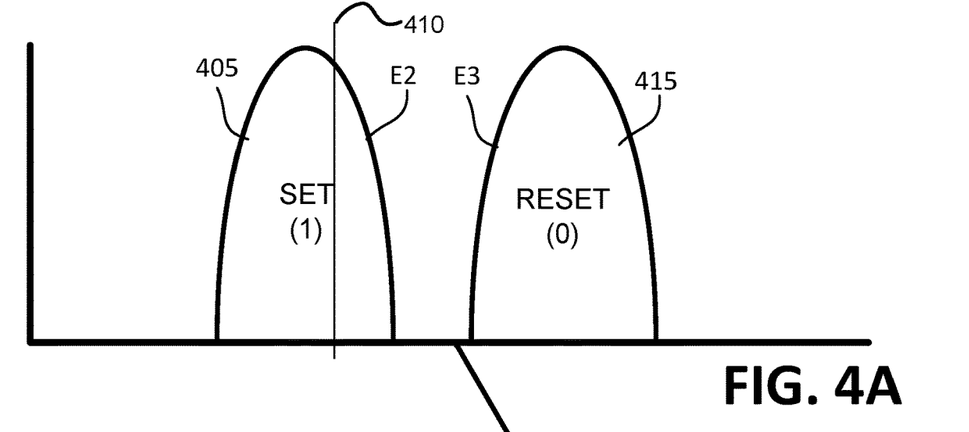
FIGS. 4A-4C illustrate the application of seasoning voltage pulses to memory cells of a memory device in accordance with some embodiments of the present disclosure.
Figure 4B:
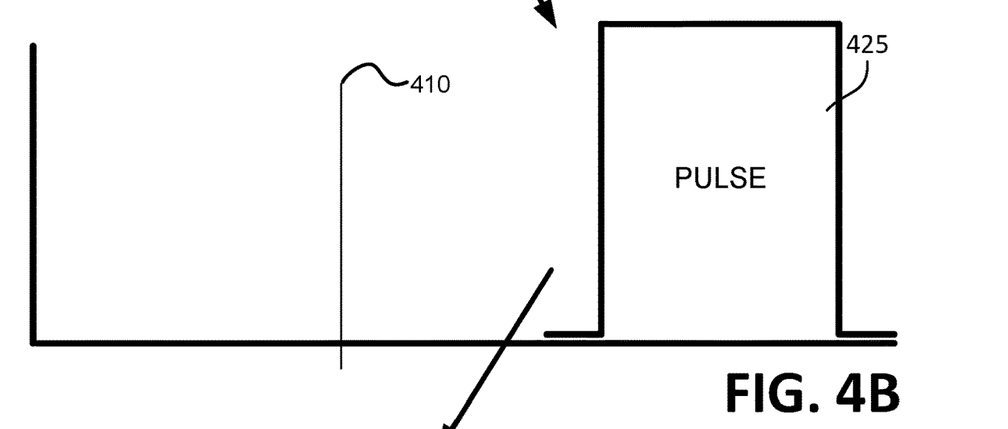
Figure 4C:
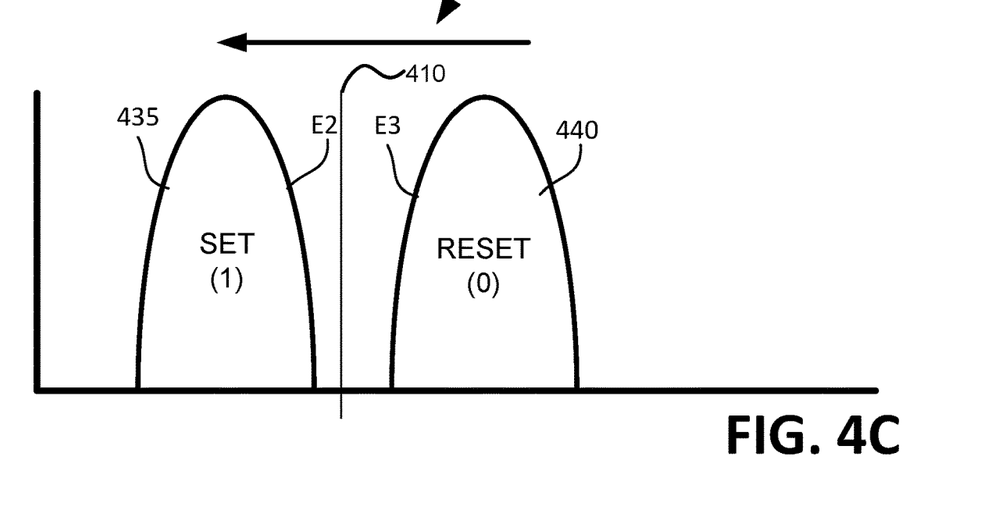

FIGS. 4A-4C illustrate the application of seasoning voltage pulses to a memory cell of a memory device in accordance with some embodiments of the present disclosure. In some embodiments, the application of the seasoning voltage pulses can be performed by the adaptive seasoning component 113 of FIG. 1 and as described above with respect to FIG. 2 and below with respect to FIG. 5.

As shown in FIG. 4A, the memory cells of a memory device can be at unstable voltage levels for set state 405 and reset state 415. In some instances, the memory cells of the memory device can be affected by high temperatures applied to the memory device during the manufacturing or assembly process. This can cause the set state 405 and reset state 415 to be at voltage levels that are higher than normal. As shown, set state 405 has a voltage level where the leading edge E2 is at a higher voltage level than the threshold voltage 410 that typically separates the set state 405 from the reset state 415. After receiving a request to perform a seasoning operation on the memory cell, the adaptive seasoning device as described herein can apply a set of high voltage pulses 425 to place the memory cells of the memory device at a voltage level associated with defined voltage state 425.

As shown in FIG. 4B, the adaptive seasoning component applies the pulse to the memory cells of the memory device. The voltage pulse 425 can be of a larger amplitude and for a longer duration than that used for a typical programming operation. As described above with respect to FIG. 2, the voltage pulses can be applied at a voltage level between 3.5 V and 4.5 V (e.g., the set state voltage level), at a voltage level between 5.6V and 6 V (e.g., the reset state voltage level), or at a voltage level that is higher than both ranges (e.g. a voltage level between 8 V and 9 V). As described above with respect to FIG. 2 and below with respect to FIG. 5, the adaptive seasoning component can apply multiple sets of voltage pulses to the memory cell until the observed error rate of the memory cells satisfy a threshold. By applying multiple sets of pulses, the voltage levels of the memory cell can be shifted such that the leading edge E2 of set state 435 and the trailing edge E3 of the reset state 440 are clearly separated by the threshold voltage 410 as shown in FIG. 4C.

As described above, the adaptive seasoning process can be performed multiple times for the memory cells of a memory device until the threshold is satisfied for the cells of that memory device. The process can adapt to differing conditions between memory devices such that it can be performed fewer times for memory devices that require fewer seasoning cycles to stabilize the voltage levels of the memory cells. Similarly, the process can be performed additional times for memory devices that require more seasoning cycles to stabilize the voltage levels of the memory cells.

Figure 5:
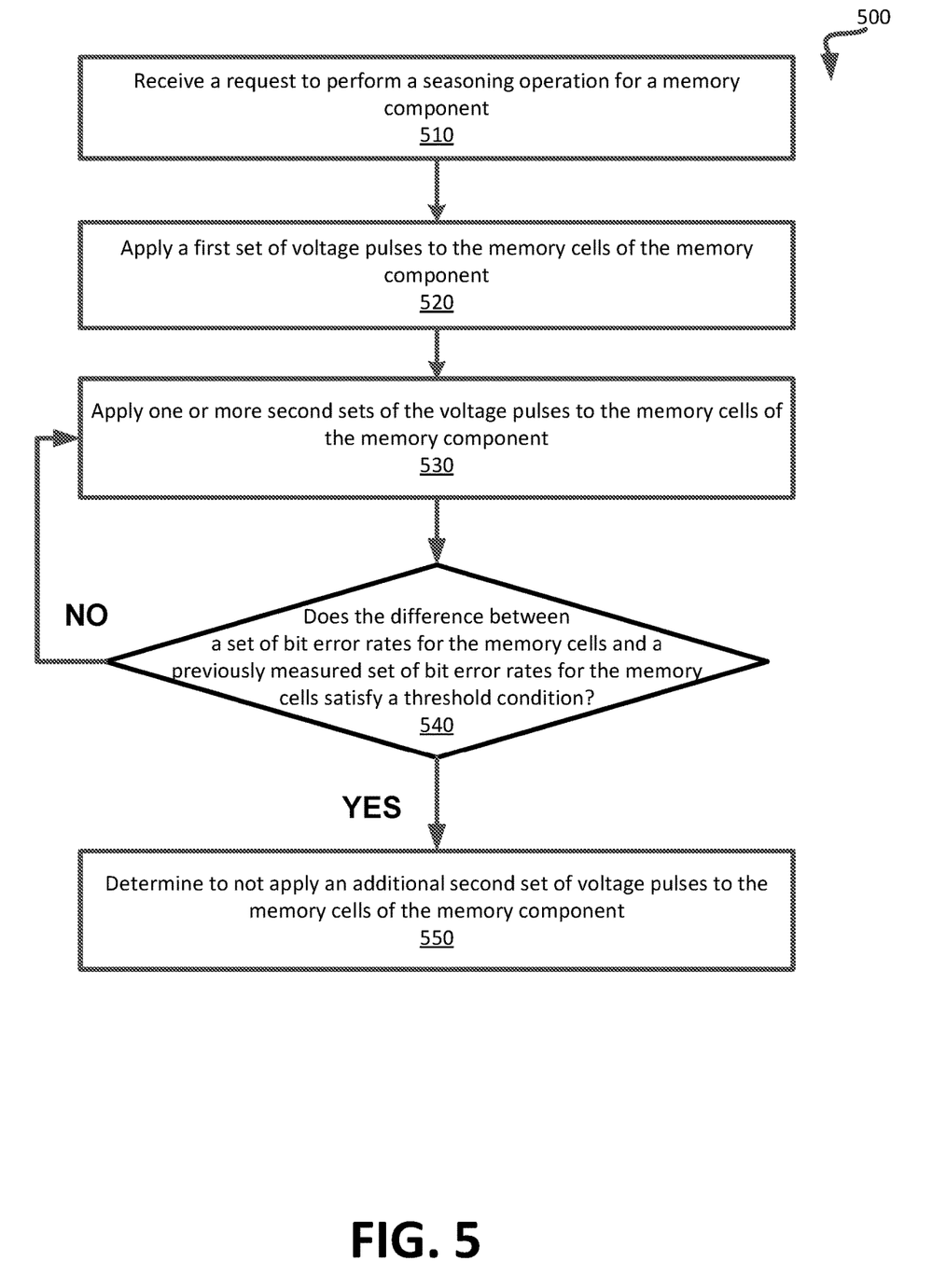
FIG. 5 is a flow diagram of an example method to apply sets of seasoning pulses to a memory device based on satisfying a threshold percentage change in error rates in accordance with some embodiments.

FIG. 5 is a flow diagram of an example method 500 to apply sets of seasoning pulses to a memory device based on satisfying a threshold percentage change in error rates in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the adaptive seasoning component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 5, at operation 510, the processing device receives a request to perform a seasoning operation for a memory device. The seasoning operation can be performed by applying multiple voltage pulses to memory cells of the memory device. In some embodiments, the request can be received from a host system. In some embodiments, the memory device can be a 3D cross-point memory device. As noted above, a 3D cross-point memory device can be made up of multiple layers of memory cells, where each layer can include a 2D grid of memory cells, and where the layers of the 3D cross-point memory device can be stacked vertically in relation to each other.

At operation 520, the processing device applies a first set of the voltage pulses to the memory cells of the memory device, where a voltage pulse of the first set of voltage pulses places the memory cells of the memory device at a voltage level associated with a defined voltage state. In some embodiments, the first set of voltage pulses can be set to a defined number (e.g., 10 pulses, 20 pulses, 50 pulses etc.) that is performed prior to the repeating cycles of additional voltage pulses described below. As described above with respect to FIG. 2, the defined voltage state can be associated with a programmed state. In other words, the defined voltage state can be a voltage state associated with a "set" voltage state (e.g., a voltage state associated with a voltage level that sets the memory cell to a value of '1'), a "reset" voltage state (e.g., a voltage state associated with a voltage level that sets the memory cell to a value of '0'), a high voltage state (e.g., a voltage state associated with a voltage level that higher than the voltage levels associated with the set or reset voltage states), or the like. Also as described above, the voltage pulses can be applied for duration associated with placing the memory cell in a programmed state. Alternatively, the voltage pulses can be applied to the memory cells for a longer duration than pulses used to place the memory cells in a programmed state.

At operation 530, the processing device applies one or more second sets of the voltage pulses to the memory cells of the memory device. In some implementations, the second set of voltages includes fewer voltage pulses than the first set of pulses performed at operation 520. For example, operation 520 performs a first set of 50 voltage pulses, operation 530 can perform one or more second sets of 10 voltage pulses until the threshold has been satisfied.

Upon the completion of the application of a second set of voltage pulses, the processing device can determine the set of bit error rates for the memory cells. In some embodiments, the processing device can determine a set of bit error rates associated with the memory cells (e.g., the E2 RBER and E3 RBER) as described above with respect to operation 230 of FIG. 2.

At operation 540, the processing device determines whether the difference between a set of bit error rates for the memory cells (e.g., the E2 RBER and E3 RBER) and a previously measured set of bit error rates (e.g., a previously measured E2 RBER and a previously measured E3 RBER) satisfies a threshold condition. In various embodiments, the processing device can make this determination by analyzing the percentage change in the E2 RBER and the E3 RBER after applying a set of voltage pulses. The processing device can determine a percentage difference between the E2 RBER measured at operation 530 and a previously measured E2 RBER (e.g., an E2 RBER measured after a previously applied set of voltage pulses). The processing device can then determine whether the percentage difference satisfies a threshold percentage. Additionally, the processing device can determine a percentage difference between the E3 RBER measured at operation 530 and a previously measured E3 RBER (e.g., an E3 RBER measured after a previously applied set of voltage pulses). The processing device can then determine whether the percentage difference satisfies a second threshold percentage.

As described above, the threshold percentages may be determined based on observed statistical information captured from other similar memory devices that are similar to the memory device. In other words, historical data relating to the observed variations in E2 RBER and E3 RBER values of other similar devices may be used to determine the threshold percentages values for the memory device. In some implementations, the historical data may be received and analyzed by a controller of the memory device. Alternatively, the historical data can be analyzed by a host system, and the resulting threshold percentages can be received from the host system.

If at operation 540, the processing device determines that the difference between the set of bit error rates and the previously measured set of bit error rates does not satisfy the threshold condition, processing returns to operation 530 to perform an additional second set of voltage pulses. If at operation 540, the processing device determines that the difference between the set of bit error rates and the previously measured set of bit error rates does satisfy the threshold condition (e.g., the percentage difference between the E2 RBER and a previously measured E2 RBER satisfies the E2 RBER threshold percentage and the percentage difference between the E3 RBER and a previously measured E3 RBER satisfies the E3 RBER threshold percentage), processing proceeds to operation 550 where the processing device determines to not apply any additional second sets of voltage pulses to the memory cells of the memory device.

As noted above with respect to FIG. 2, in some implementations, where the set of bit error rates do not ever satisfy the threshold conditions, the processing device can determine not to perform any additional sets of voltage pulses to the memory cells based on the number of sets of voltage pulses previously performed. In other words, if the number of total sets of voltage pulses performed on the memory cells satisfies a threshold number, then the processing device can determine not to perform any additional sets of voltage pulses.

Figure 6:
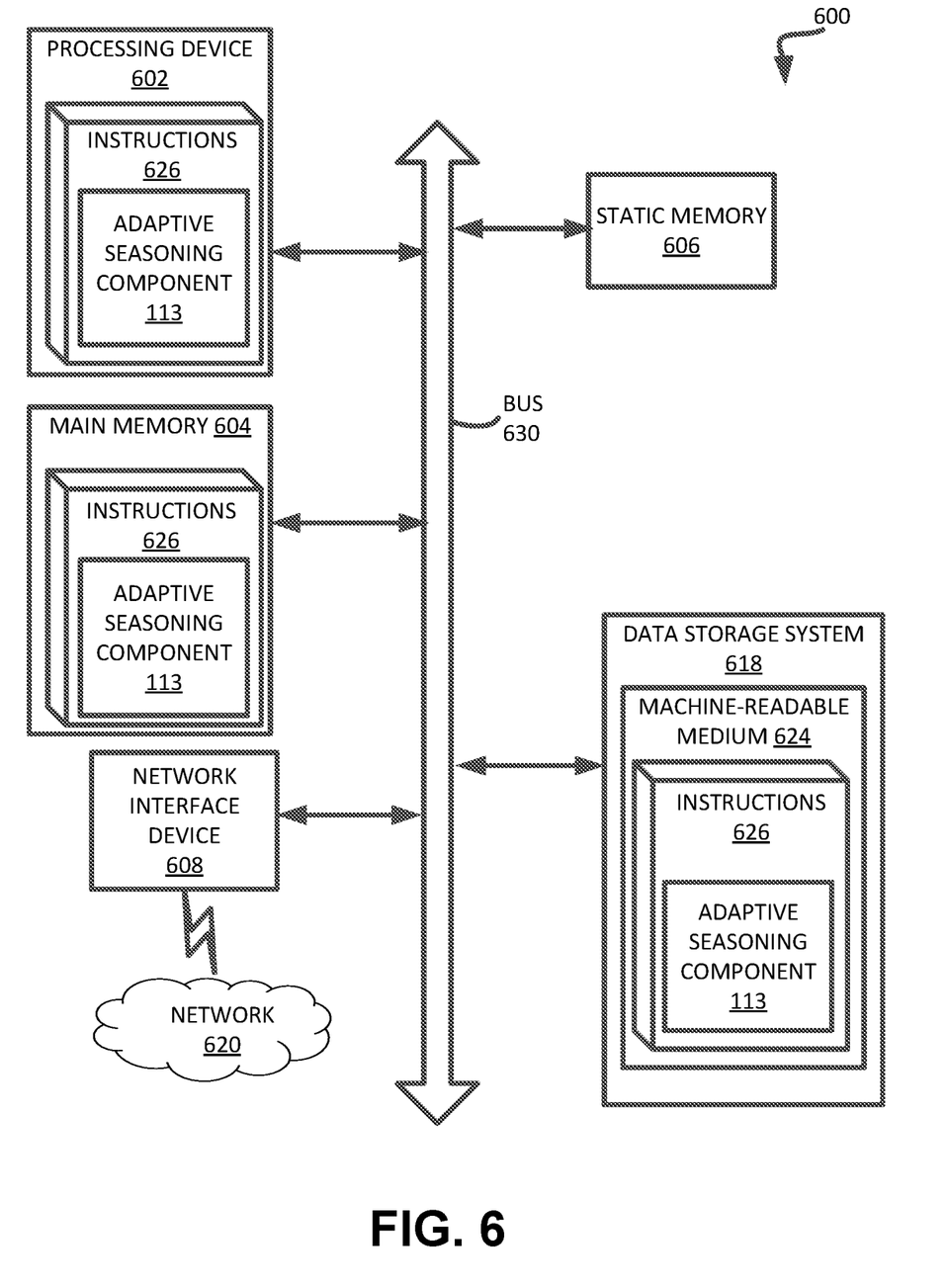
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to adaptive seasoning component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 508 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an adaptive seasoning component (e.g., the adaptive seasoning component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    causing, by a processing device, a first set of a plurality of voltage pulses to be applied to memory cells of a memory device, a voltage pulse of the first set of the voltage pulses placing the memory cells of the memory device at a voltage level associated with a defined voltage state;
    determining a set of bit error rates associated with the memory cells of the memory device in view of a data mapping pattern for the memory cells of the memory device, wherein the data mapping pattern assigns a voltage level associated with a reset state to at least a portion of the memory cells of the memory device; and
    determining whether to apply one or more second sets of the voltage pulses to the memory cells of the memory device in view of a comparison between the set of bit error rates for the memory cells and a previously measured set of bit error rates for the memory cells.

2. The method of claim 1, further comprising:
    receiving a request to perform a seasoning operation for the memory device, the seasoning operation comprising applying the plurality of voltage pulses to the memory cells of the memory device.

3. The method of claim 1, wherein the defined voltage state is associated with a programmed state, the method further comprising:
    determining a first voltage pulse duration associated with placing a memory cell in the programmed state; and
    applying the one or more second sets of voltage pulses at a second voltage pulse duration that is longer than the first voltage pulse duration.

4. The method of claim 1, wherein determining whether to apply the one or more second sets of the voltage pulses to the memory cells of the memory device comprises:
    determining whether a difference between the set of bit error rates and the previously measured set of bit error rates satisfies a threshold condition.

5. The method of claim 4, further comprising:
    responsive to determining that difference between the set of bit error rates and the previously measured set of bit error rates does not satisfy the threshold condition, applying the one or more second sets of the voltage pulses to the memory cells of the memory device until the difference between the set of bit error rates for the memory cells and the previously measured set of bit error rates for the memory cells satisfies the threshold condition.

6. The method of claim 4, further comprising:
    responsive to determining that the difference between the set of bit error rates and the previously measured set of bit error rates does not satisfy the threshold condition, applying one of the one or more second sets of the voltage pulses to the memory cells of the memory device; and
    responsive to determining that the difference between the set of bit error rates and the previously measured set of bit error rates satisfies the threshold condition, determining to not apply the one or more second sets of the voltage pulses to the memory cells of the memory device.

7. The method of claim 1, wherein determining the set of bit error rates comprises:
    determining a first bit error rate associated with a first portion of the memory cells of the memory device, the first portion of memory cells having a first voltage state associated with a set state; and
    determining a second bit error rate associated with a second portion of the memory cells of the memory device, the second portion of memory cells having a second voltage state associated with a reset state.

8. The method of claim 7, wherein determining the first bit error rate comprises:
    determining a data mapping pattern for the memory cells of the memory device, wherein the data mapping pattern assigns a first voltage level associated with the reset state to a third portion of the memory cells of the memory device and assigns a second voltage level associated with the set state to a fourth portion of the memory cells of the memory device;
    performing a program operation on the memory device to set the memory cells of the memory device to a set of voltage levels in view of the data mapping pattern;
    performing a read operation of the memory cells of the memory device to generate a result set;
    comparing the result set of the read operation to the data mapping pattern; and
    determining the second bit error rate based on the comparison.

9. The method of claim 7, wherein determining the second bit error rate comprises:
    determining a data mapping pattern for the memory cells of the memory device, wherein the data mapping pattern assigns a voltage state associated with the reset state to at least a portion the memory cells of the memory device;
    performing a program operation on the memory device to set the memory cells of the memory device to a set of voltage levels in view of the data mapping pattern;

performing a read operation of the memory cells of the memory device;

comparing a result set of the read operation to the data mapping pattern; and determining the second bit error rate based on the comparison.

10. The method of claim 4, wherein determining whether the difference between the set of bit error rates and the previously measured set of bit error rates satisfies the threshold condition comprises:

determining a first percentage difference between the first bit error rate and a previously measured first bit error rate;

determining a second percentage difference between the second bit error rate and a previously measured second bit error rate;

determining whether the first percentage difference satisfies a first threshold percentage; and determining whether the second percentage difference satisfies a second threshold percentage.

11. A system comprising:

a memory device; and a processing device, operatively coupled with the memory device, to perform operations comprising:

causing a first set of a plurality of voltage pulses to be applied to memory cells of a memory device, a voltage pulse of the first set of the voltage pulses placing the memory cells of the memory device at a voltage level associated with a defined voltage state;

determining a set of bit error rates associated with the memory cells of the memory device in view of a data mapping pattern for the memory cells of the memory device, wherein the data mapping pattern assigns a voltage level associated with a reset state to at least a portion of the memory cells of the memory device; and determining whether to apply one or more second sets of the voltage pulses to the memory cells of the memory device in view of a comparison between the set of bit error rates for the memory cells and a previously measured set of bit error rates for the memory cells.

12. The system of claim 11, wherein the defined voltage state is associated with a programmed state, the operations further comprising:

determining a first voltage pulse duration associated with placing a memory cell in the programmed state; and applying the one or more second sets of voltage pulses at a second voltage pulse duration that is longer than the first voltage pulse duration.

13. The system of claim 11, wherein determining whether to apply the one or more second sets of the voltage pulses to the memory cells of the memory device comprises:

determining whether a difference between the set of bit error rates and the previously measured set of bit error rates satisfies a threshold condition.

14. The system of claim 13, wherein the operations further comprise:

responsive to determining that difference between the set of bit error rates and the previously measured set of bit error rates does not satisfy the threshold condition, applying the one or more second sets of the voltage pulses to the memory cells of the memory device until the difference between the set of bit error rates for the memory cells and the previously measured set of bit error rates for the memory cells satisfies the threshold condition.

15. The system of claim 13, wherein the operations further comprise:

responsive to determining that the difference between the set of bit error rates and the previously measured set of bit error rates does not satisfy the threshold condition, applying one of the one or more second sets of the voltage pulses to the memory cells of the memory device; and responsive to determining that the difference between the set of bit error rates and the previously measured set of bit error rates satisfies the threshold condition, determining to not apply the one or more second sets of the voltage pulses to the memory cells of the memory device.

16. The system of claim 11, wherein determining the set of bit error rates comprises:

determining a first bit error rate associated with a first portion of the memory cells of the memory device, the first portion of memory cells having a first voltage state associated with a set state; and determining a second bit error rate associated with a second portion of the memory cells of the memory device, the second portion of memory cells having a second voltage state associated with a reset state.

17. The system of claim 13, wherein determining whether the difference between the set of bit error rates and the previously measured set of bit error rates satisfies the threshold condition comprises:

determining a first percentage difference between the first bit error rate and a previously measured first bit error rate;

determining a second percentage difference between the second bit error rate and a previously measured second bit error rate;

determining whether the first percentage difference satisfies a first threshold percentage; and determining whether the second percentage difference satisfies a second threshold percentage.

18. A non-transitory computer-readable medium comprising instructions, which when executed by a processing device, cause the processing device to perform operations comprising:

causing a first set of a plurality of voltage pulses to be applied to memory cells of a memory device, a voltage pulse of the first set of the voltage pulses placing the memory cells of the memory device at a voltage level associated with a defined voltage state;

determining a set of bit error rates associated with the memory cells of the memory device in view of a data mapping pattern for the memory cells of the memory device, wherein the data mapping pattern assigns a voltage level associated with a reset state to at least a portion of the memory cells of the memory device; and determining whether to apply one or more second sets of the voltage pulses to the memory cells of the memory device in view of a comparison between the set of bit error rates for the memory cells and a previously measured set of bit error rates for the memory cells.

19. The non-transitory computer-readable medium of claim 18, wherein determining whether to apply the one or more second sets of the voltage pulses to the memory cells of the memory device comprises:

determining whether a difference between the set of bit error rates and the previously measured set of bit error rates satisfies a threshold condition.

20. The non-transitory computer-readable medium of claim 19, wherein the operations further comprise:

responsive to determining that the difference between the set of bit error rates and the previously measured set of bit error rates does not satisfy the threshold condition, applying the one or more second sets of the voltage pulses to the memory cells of the memory device until the difference between the set of bit error rates for the memory cells and the previously measured set of bit error rates for the memory cells satisfies the threshold condition.

\* \* \* \* \*